United States Patent [19]

Furuya et al.

[11] Patent Number: 5,436,096
[45] Date of Patent: Jul. 25, 1995

[54] METHOD OF MANUFACTURING X-RAY EXPOSURE MASK

[75] Inventors: Kazuhito Furuya, Yokohama; Yasuyuki Miyamoto, Higashikurume, both of Japan

[73] Assignee: Tokyo Institute of Technology, Tokyo, Japan

[21] Appl. No.: 963,695

[22] Filed: Oct. 20, 1992

[30] Foreign Application Priority Data

Apr. 7, 1992 [JP] Japan .................... 4-85567

[51] Int. Cl.⁶ ............................. G03F 9/00
[52] U.S. Cl. ......................... 430/5; 430/269; 430/311; 430/321; 430/396; 378/35; 437/107
[58] Field of Search ............ 430/5, 22, 269, 321, 430/311, 396; 378/35; 437/107

[56] References Cited

U.S. PATENT DOCUMENTS 4,806,442  2/1989  Shirasaki .................... 430/4

FOREIGN PATENT DOCUMENTS 62-079-613   4/1987  Japan .
1296614     11/1989  Japan .
2125606      5/1990  Japan .

OTHER PUBLICATIONS

Jpn. J. Appl. Phys. vol. 31 (1992) pp. L432–L435; Miyamoto et al. "Fabrication of Ultrafine X-Ray Mask Using Precise Crystal Growth Technique" Apr. 1, 1992.

Appln. Phys. Lett., 36(1), Jan. 1, 1980, American Institute of Physics, pp. 93–96, "Replication of 175-A Lines and Spaces in Polymethylmethacrylate Using X-ray Lithography", D. C. Flanders.

Primary Examiner—Mark A. Chapman
Attorney, Agent, or Firm—Spencer, Frank & Schneider

[57] ABSTRACT

The present invention can precisely manufacture an X-ray mask pattern at intervals of less than 10 nm by using a thin film crystalline growth method, applying a laminated layer body of a fine structure having a precision of less than 1 atomic layer onto a substrate, and utilizing the difference in X-ray absorption coefficients. A method of manufacturing an X-ray exposure mask comprises the steps of alternately laminating two kinds of material consisting of a combination of a semiconductor, metal and insulator having substantially equal lattice constants and largely different coefficients of X-ray absorption on a substrate of a crystal body to thicknesses of less than 10 Å by an epitaxial crystal growth method, and manufacturing a mask for exposing streak-like X-rays on a desired resist as a result of the largely different coefficients of X-ray absorption between each layer.

8 Claims, 10 Drawing Sheets

FIG_1A
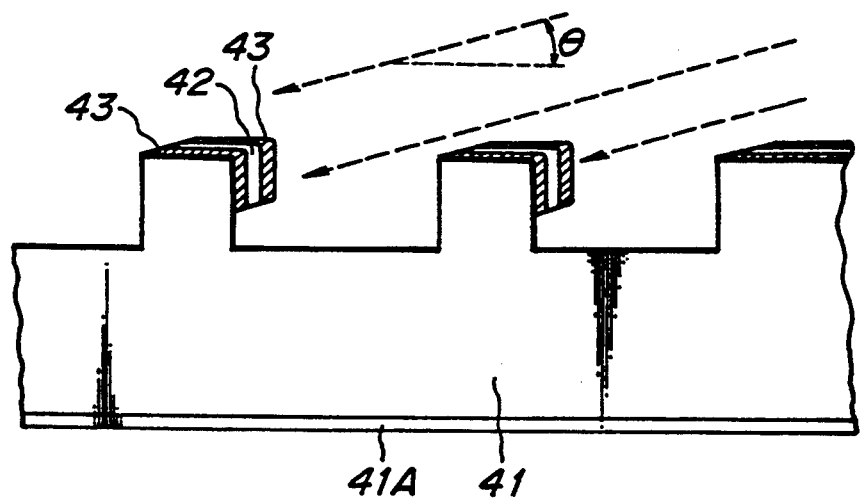
FIG_1B
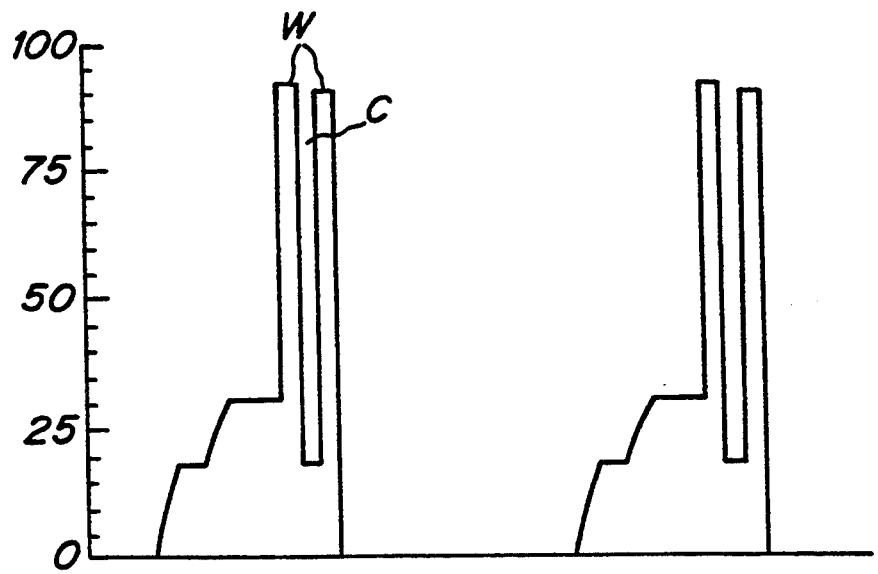

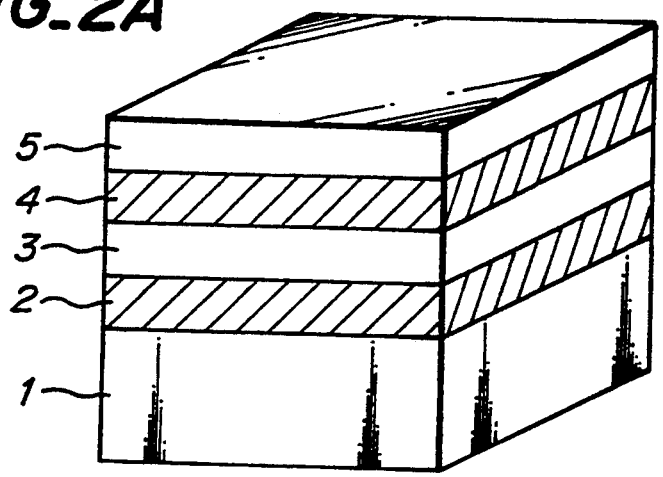
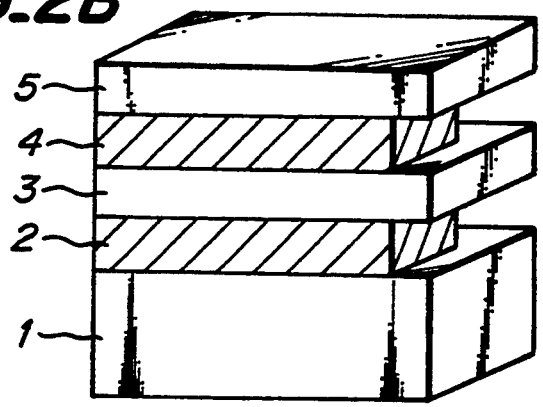
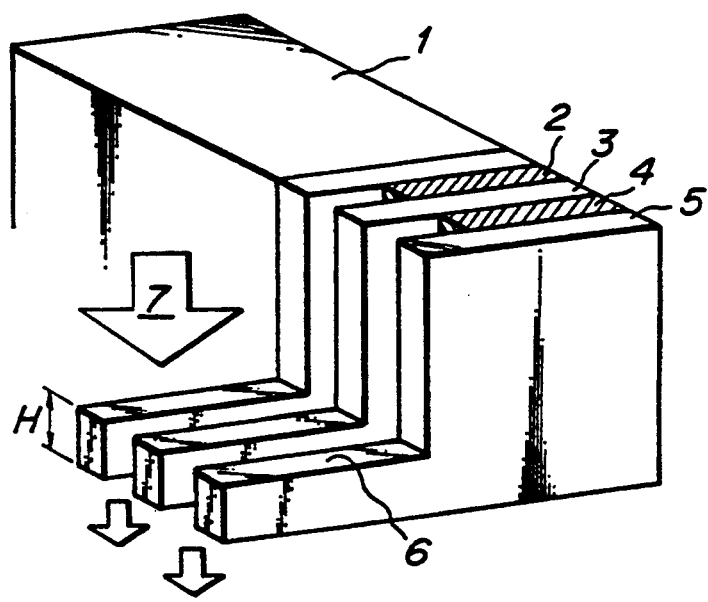

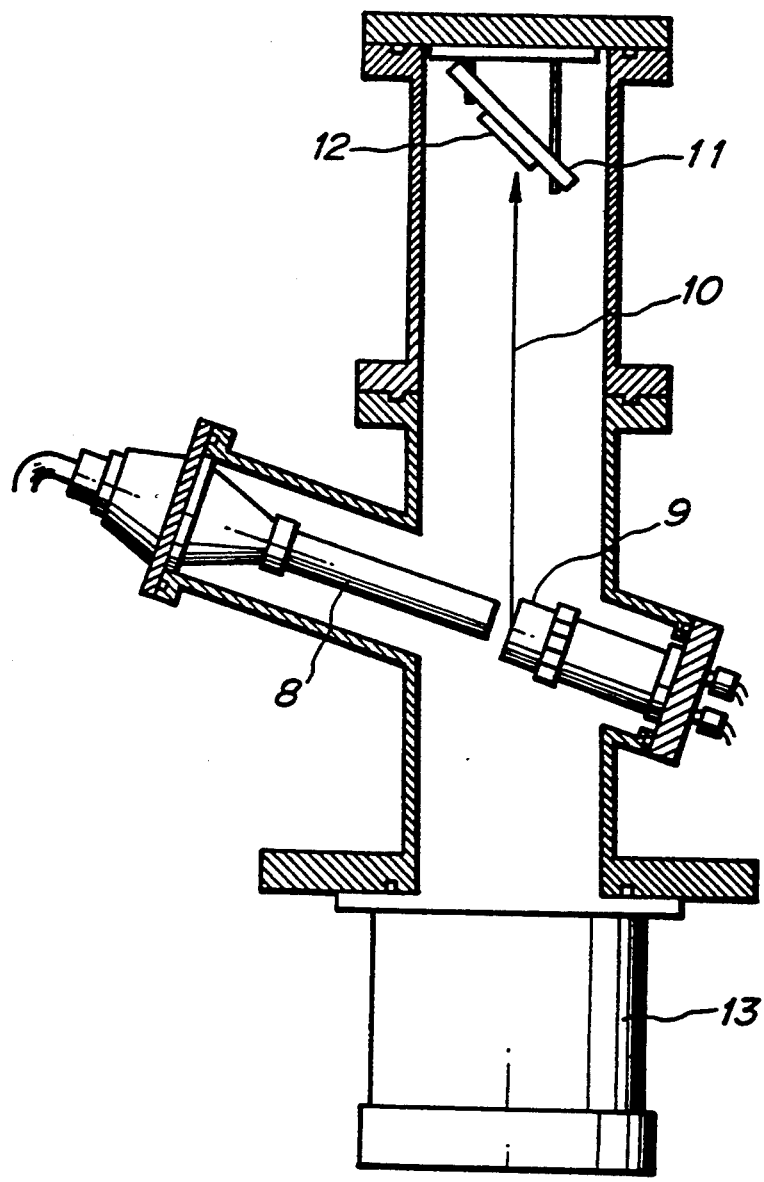
FIG_4

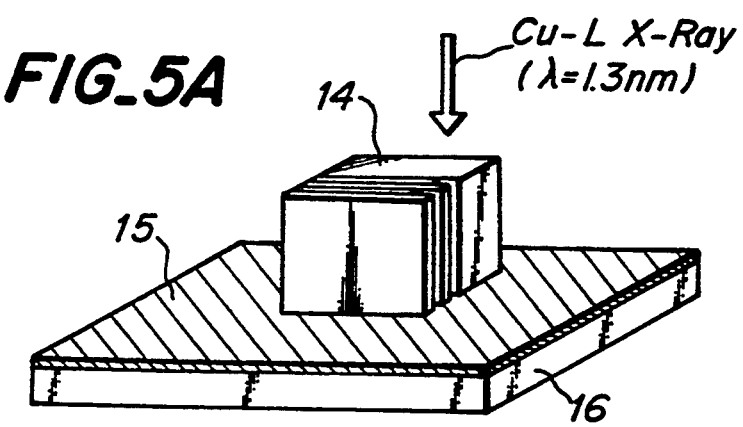
*FIG._5A*
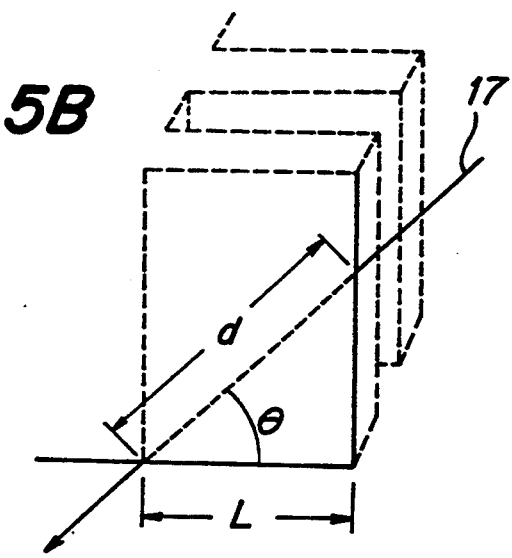
*FIG._5B*
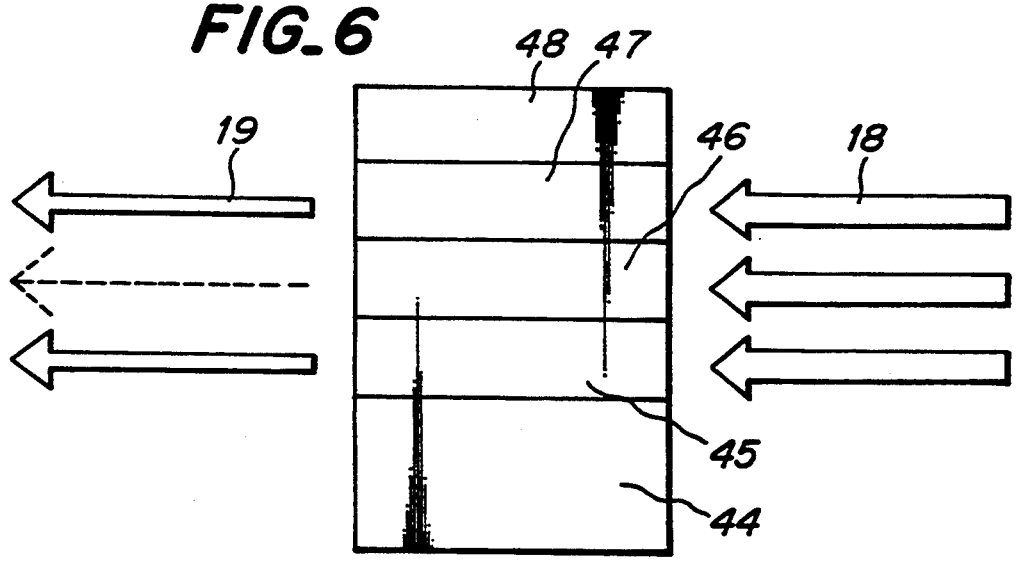
*FIG._6*

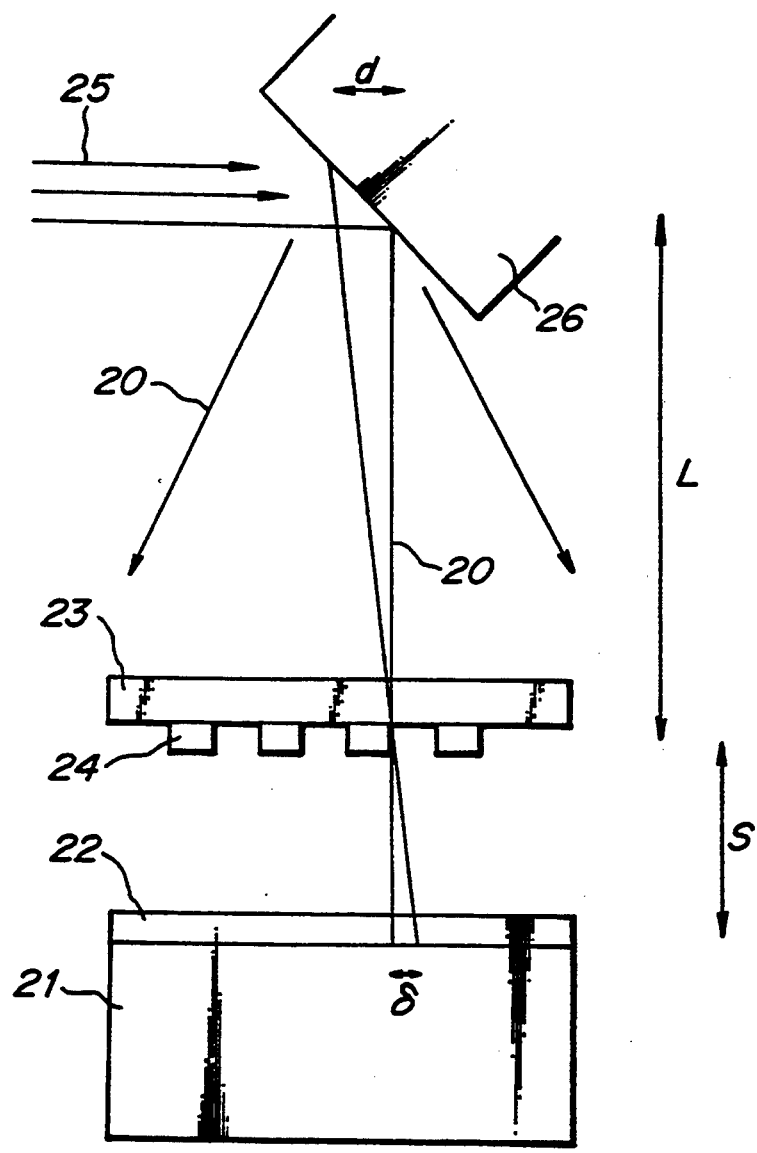
FIG_10

FIG_11A
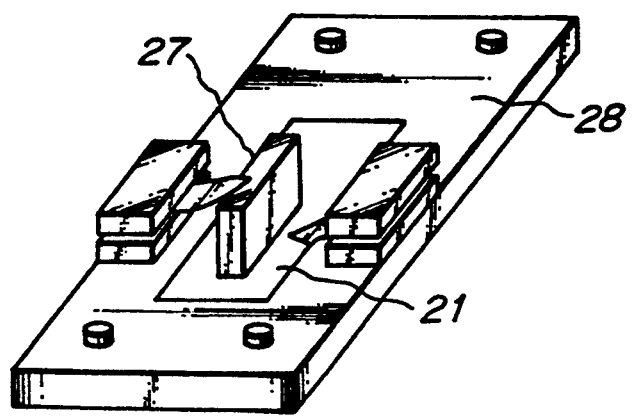
FIG_11B
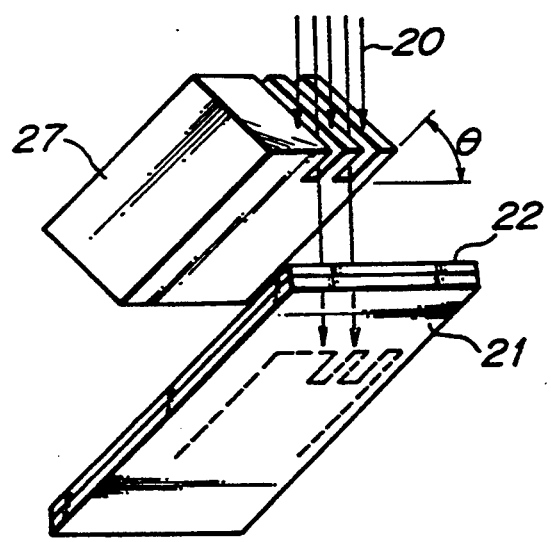

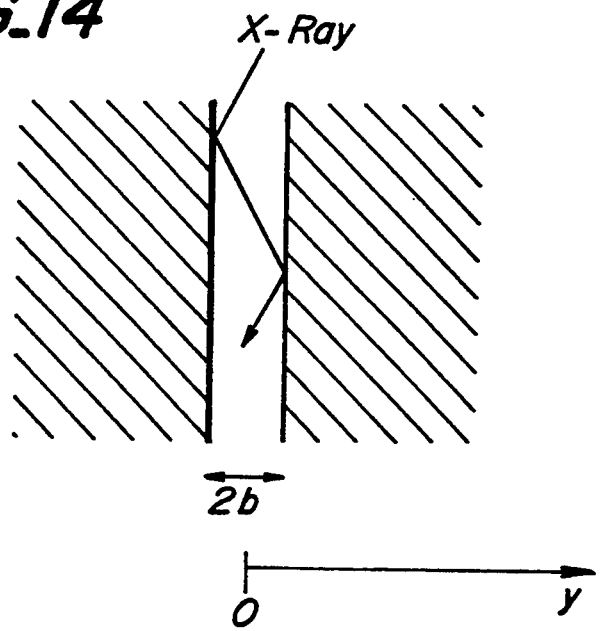
FIG._14
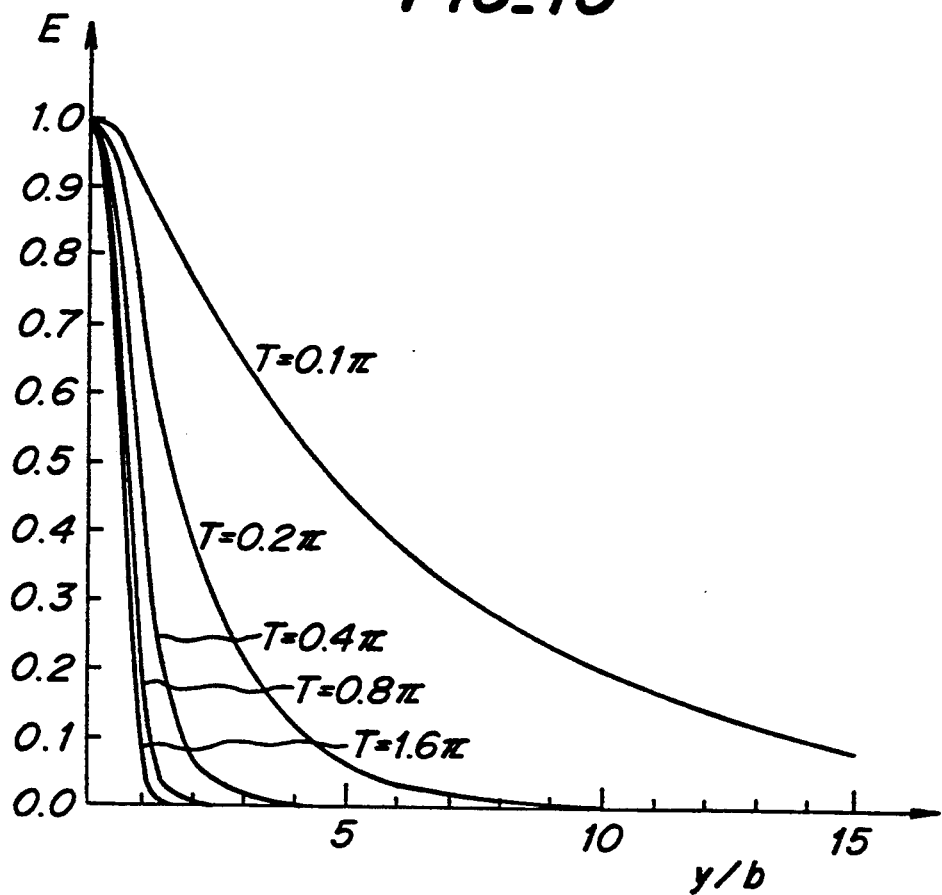
FIG._15

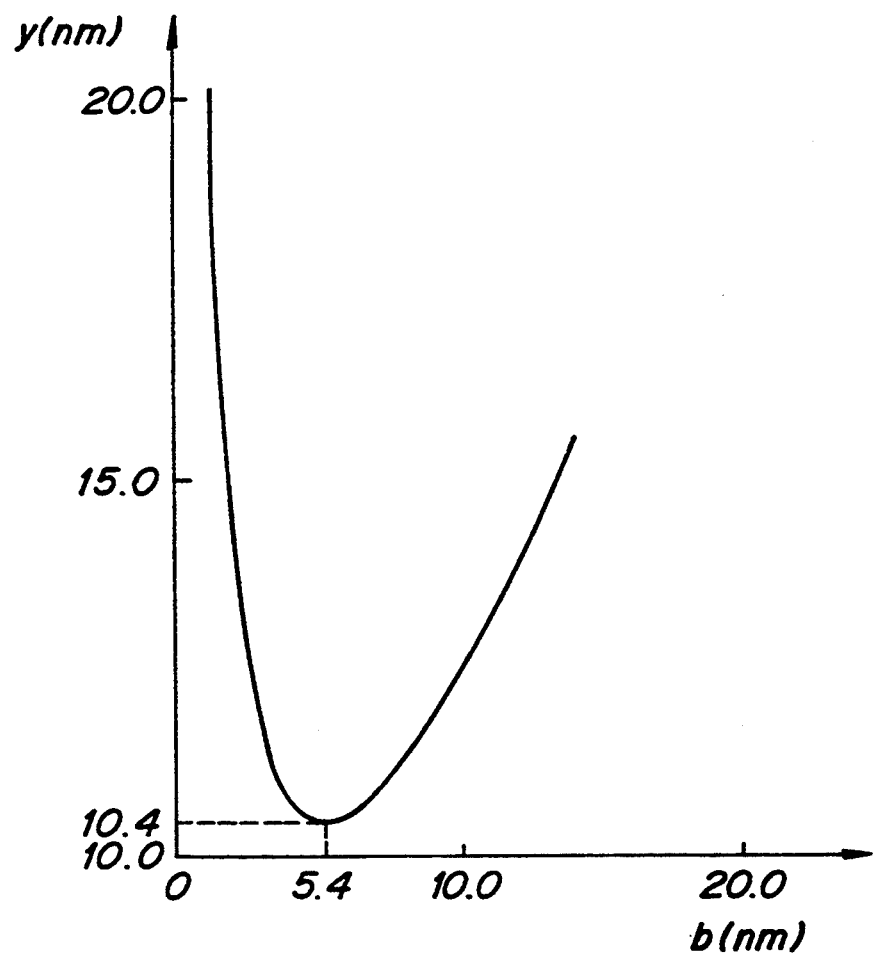
FIG_16

METHOD OF MANUFACTURING X-RAY EXPOSURE MASK

BACKGROUND OF THE INVENTION

1. Field of the Invention

The present invention relates to a novel method of manufacturing an exposure mask having an ultramicrostructure for an X-ray exposure method favorable for future use, in rapidly micronizing lithography technique in order to increase the performance of high density integrated circuit and high performance transistors used in the electronics field.

2. Description of the related Art

X-ray exposure lithography technique show promise to break beyond light exposure lithography techniques.

However, X-ray exposure methods are proving to be difficult to implement. As a mask for preventing X-rays, a fine pattern of metal such as gold, tungsten, and the like must be formed having enough thickness to absorb X-rays on a thin film. A widely used technique for drawing a comparatively fine pattern which is not mass-produced at present, is electron beam exposure method which can be combined with the most popular mask manufacturing method namely of forming a fine metal pattern by combining this exposure method with etching, lift-off and plating methods. However, it is very difficult to form an ultrafine metal pattern having sufficient thickness by dispersion in a resist for electron beams to. This is because of the problem of ultramicronization in the electron, beam exposure method or by dispersion in a structure under resist such as metal, substrate and the like, and micronization of about less than 10 nm of frequency is almost limited at present difficult to achieve.

On the other hand, in the formation of a layered structure, it is easy to provide film thickness controllability of about 1 nm. Oblique deposition is one example of a mask using the layered structure, (see Appln. Phys. Lett., 36 (1), 1 Jan. 1980, American Institute of Physics). As shown in FIGS. 1A and 1B, this method forms a mask having a minimum line width of about 2 nm obliquely depositing carbon and tungsten on a periodic square wave polyamide membrane and forms a fine line structure up to 17.5 nm. However, this method reaches a difficult point for minimizing a square wave period because of the use of the oblique deposition method.

At present, the most closely studied method of forming a layered structure is a thin film crystal growing method, compound semiconductor crystal growth, ha been particularly closely studied reaching controllability of switching compositions of less than one atomic layer. At the same time, it is possible to grow crystals on the whole side surface of a deep groove. These advantages are due to crystal growth under such a condition that a growing seed is largely diffused on the crystal surface, thereby maintaining flatness in crystal growth. It is further possible to form a thin film to within one atomic layer unit on the whole crystal growth surface if crystal growth on the thin film is carried out by using an epitaxial growth technique.

X-ray exposure is an exposure method for breaking a limit by wavelength of light exposure with the use of X-rays. However, x-ray exposure introduces the difficulty of manufacturing exposure masks. That is, it is terribly difficult to form a mask which can prevent X-rays on the order of which is 10 nm order required for a very fine X-ray mask.

SUMMARY OF THE INVENTION

The present invention aims to obviate the shortcomings of the conventional methods. One object of the invention is to provide a method of forming an X-ray mask having an ultrafine structure which has not been seen before, by applying a finely structured laminated body having a precision of less than 1 atomic layer onto a substrate by using a thin film crystal growth method, and enabling a thin film to be formed on the mask on side surfaces of narrowly spaced grooves.

These and other objects are accomplished according to the invention by the provision of a method of manufacturing an X-ray exposure mask comprising the steps of alternately laminating two kinds of material consisting of a combination of a semiconductor, metal and insulator having a substantially equal lattice constant and a largely different coefficient of X-ray absorption on a substrate of a crystal body in a thickness of less than 10 Å by an epitaxial crystal growth method, and manufacturing a mask for exposing streak-like X-rays on a desired resist with the aid of a difference of the coefficients of X-ray absorption between each layer.

The above and after objects of the invention are further accomplished by the provision of a; and method of manufacturing an X-ray exposure mask comprising the steps of alternately laminating two kinds of material consisting of a combination of a semiconductor, metal and insulator having a substantially equal lattice constant and a largely different coefficient of X-ray absorption on a substrate by an epitaxial growth method for steeply switching the composition a precision of less than 1 atomic layer, and exposing it to X-rays, thereby manufacturing a mask for exposing streak-like X-rays on a resist with precision of less than 10 Å with the aid of a difference of the coefficients of X-ray absorption between each other.

The above objects of the invention are further accomplished by the provision of a method of manufacturing an X-ray exposure mask comprising the steps of epitaxially growing two kinds of material consisting of a combination of a semiconductor, metal and insulator having a substantially equal lattice constant and a largely different coefficient of X-ray absorption on the uneven surface of a substrate consisting of a crystal body, forming a thin film on the surface and side surfaces thereof, and forming a thin film on said surface and side surfaces with very narrow spaces therebetween by diffusion of the material.

The invention is also accomplished by the provision of a method of manufacturing an X-ray exposure mask comprising the steps of alternately laminating two kinds of material consisting of a combination of a semi-conductor, metal and insulator having a substantially equal lattice constant and a largely different coefficient of X-ray absorption on a substrate of a crystal body with a periodic structure having a thickness of less than 10 Å by an epitaxial crystal growth method, selectively etching either material for forming this periodic structure, forming an uneven difference of at least more than 2000 Å between adjacent layers of said laminate body, and manufacturing a mask for exposing streak-like X-rays on a desired resist with the aid of a difference of the coefficients of X-ray absorption between each layer.

The above object is alternatively accomplished by the provision of a; and method of manufacturing an X-ray exposure mask comprising the steps of alternately laminating two kinds of materials consisting of a combination of a semi-conductor, metal and insulator having a substantially equal lattice constant and a not particularly different coefficient of X-ray absorption in thin layers of at least less than 10 Å in thickness by an epitaxial crystal growth method, removing a part of one thin film layer of said thin film laminate body by selective etching, forming an optical path difference of at least more than 2000 Å between adjacent layers of said laminate layer body, and manufacturing a mask for exposing streak-like X-rays on a desired resist with the aid of a difference of X-ray absorption coefficients between each layer.

The substrate is a support of a thin layer laminate body simply applied thereto, and has no particular limitation, but it should be a crystal body. When the substrate is a crystal body, the thin film and the substrate are well attached to each other, and a thin film of uniform thickness can be formed on the substrates.

If the substrate is non-crystalline, such as glass, metal, ceramics and the like, the thickness of the thin film becomes an unevenly dispersed island, and is not suitable to form a thin film having a uniform thickness.

BRIEF DESCRIPTION OF THE DRAWINGS

FIGS. 1(A) and 1(B) are a cross section for explaining a conventional method and a schematic diagram of X-ray absorption characteristics.

FIGS. 2(A) and 2(B) are perspective views for explaining a method of manufacturing an X-ray exposure mask according to the present invention.

FIG. 3 is a perspective view for explaining the method of manufacturing an X-ray exposure mask according to the present invention.

FIG. 4 is a cross section of an X-ray exposure apparatus used in the present invention.

FIGS. 5(A) and 5(B) are perspective views acquired by enlarging a part of FIG. 4 for explanation.

FIG. 6 is a schematic view of an X-ray exposure mask produced by an epitaxial crystal growth method according to the present invention.

FIG. 10 is an explanatory view showing the transcribing condition to a resist with the use of an X-ray exposure mask according to the present invention.

FIG. 11(A) and 11(B) are exposure outlines with the use of an X-ray exposure mask according to the present invention.

FIG. 14 shows energy distribution for the case of using an X-ray exposure mask according to the present invention.

FIG. 15 is an energy distribution curve to each value of a waveguide path width T for the case of using an X-ray exposure mask according to the present invention.

FIG. 16 is a characteristic curve showing the minimum value ($2y$) of a pitch to core width for the case of using an X-ray exposure mask according to the present invention.

Figure 7:
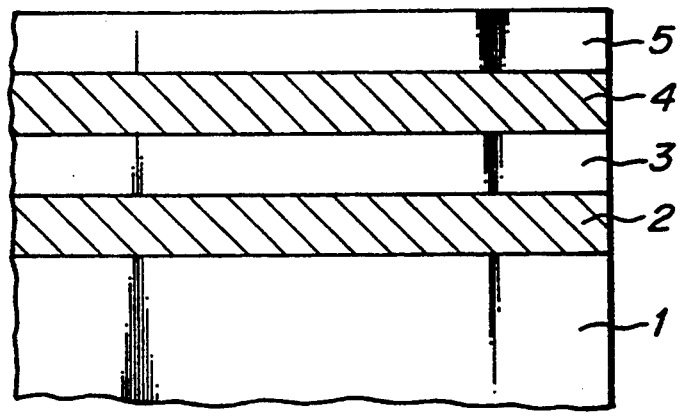
FIG. 7 shows a process for manufacturing an X-ray exposure mask according to the present invention.
Figure 8:
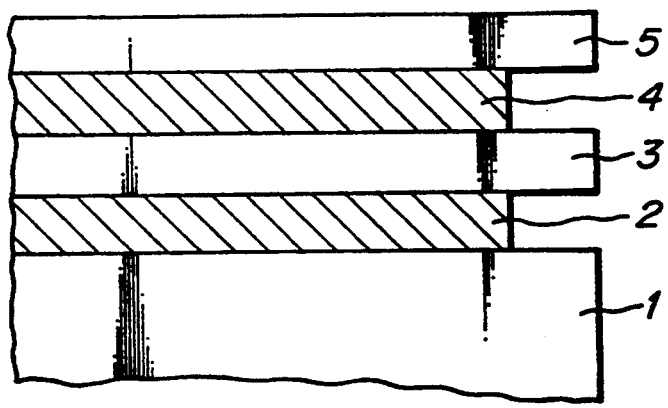
FIG. 8 shows a process for manufacturing an X-ray exposure mask according to the present invention.

Through different views of the drawings in FIGS. 1–16, 1 is a InP substrate, 2, 4 are GaInAs thin film layers, 3 and are 5 InP thin film layers, 6 is a recess portion, 7 is a direction of X-rays, H is optical path length of the X-rays, 8 is a electron gun, 9 is a Cu target, 10 is an X-ray, 11 is a stage, 12 is a sample, 13 is a vacuum pump, 14 is a mask, 15 is a PMMA resist, 16 is a Si substrate, 17 is a direction of X-ray, L is a length acting as a mask, 4 d is a optical path length of X-ray, $\theta$ is an angle for applying X-rays, 18 is an incident X-ray, 19 is an output X-ray, 20 is an X-ray stage, 21 is a transcription substrate, 22 is a resist, 23 is a mask substrate, 24 is an X-ray absorber, 25 is an incident electron, 26 is an Cu-target, 27 is a mask, 28 is a stage, 41 is a polyimide substrate, 41A is an aluminum substrate, 42 is a carbon thin film, 43 is a tungsten thin film, W X-ray absorption characteristic by tungsten, C is an X-ray absorption characteristics by carbon, 44 is a GaP substrate, 47 an AlP thin film layer, 48 a GaP thin film layer.

DESCRIPTION OF THE PREFERRED EMBODIMENTS

The invention enables the formation of an X-ray mask having a close ultrafine structure, which has not previously been materialized, by using a thin film crystal growth method. A fundamental condition of this mask is to transmit X-rays through the layered crystalline structure deposited in the layer thickness direction so as to cross its interface in parallel thereto. When the crystal growth method of the present invention is compound with the conventional method of oblique deposition with the use of the same layered structure as the prior art, there are the following three advantageous points.

First, a pattern can be formed with high precision because flat film thickness controllability of less than 1 atomic layer can be obtained.

Second, growth to the whole side surface of a deep groove is possible, so that when a thin film grown on the side surface of the deep groove is used for preventing X-rays, density can be significantly increased.

These advantages are achieved because diffusion of a growing seed on the crystal surface remains large, thereby maintaining flatness in crystal growth.

The third advantage is that a growth rate onto the side surface can be made the same as the growth rate onto the plane, regardless of groove depth with the use of recently developing atomic layer epitaxial growth techniques and a very close pattern can be formed at single atomic layer intervals.

Since a crystal is grown in the present invention, the combination of materials is limited, so that whether or not the contrast as a mask can fully be taken is an important matter. Therefore, when a coefficient of absorption of a typical material series is calculated on the basis of lattice-aligned compound semiconductors, a combination of GaP/AlP and Al-L line can have the largest difference of absorption coefficient between lattice-aligned compound semiconductors. In this combination, a value of 10 can be obtained with an X-ray passing length is 1.57 $\mu$m, and a value of 8 of contrast can be obtained with an X-ray passing length is 1.41 $\mu$m. If X-ray passing length of the Cu—K line is 10 μm, the contrast can take 6.4 digits, and attenuation of X-rays by AlP is limited to ¼.

On the other hand, for the case of a combination of materials having a small difference of absorption coefficient, after growing the crystal, one layer is removed by selective etching and a mask of high contrast can be manufactured. For example, in for the combination of GaAs and C—K line, a contrast of 10 is possible with 0.17 μm thickness, and contrast of 8 is possible with 0.15 μm, which is substantially the same absorption coefficient as that of gold in a typical X-ray absorber. Therefore, even if only compound semiconductors for carrying out very precise crystal growth are used, an x-ray mask can be fully formed.

A principle of the present invention is derived from a fundamental idea of applying materials having different compositions with ultrathin thicknesses of one atomic layer to a substrate by an epitaxial crystal growth method. Here, a thickness of one atomic layer in the epitaxial crystal growth method is 0.3 nm (about 3 Å), and it is easy to form a laminated body by alternately applying different materials on a substrate.

One method of manufacturing the most improved X-ray mask by a conventional method, is the Flanders' method, but this method is a mere experiment of alternately depositing tungsten (W) and carbon (C) on an uneven surface of a substrate by a deposition method, and simply reports that a line of 175 Å is broken.

The present invention can form a thin film on a substrate by an epitaxial crystal growth method, so that the thickness of the thin film can precisely be controlled by controlling the thickness of one atomic layer (3 Å or 0.3 nm). In this manner, laminate body of less than 100 Å in thickness can easily be manufactured. Therefore, materials of the laminated body of the thin film can optionally be combined and selected.

Materials of a thin film laminated on a substrate should be a combination of materials for epitaxial crystal growth and a substrate should consist of materials for growing epitaxial crystals. If the substrate is an amorphous material such as glass, metal or ceramics, the thickness becomes an uneven dotted island, and a thin film of uniform thickness cannot be smoothly formed on the substrate.

Contrary to the above, if the substrate is a crystal body, a thin film having uniform thickness can be smoothly formed on the substrate. Therefore, the substrate should be a crystal body.

Next, thin films applied onto the substrate are alternately periodically grown by an epitaxial crystal growth method, so that if the material is selected from a combination of materials having equal or approximately equal lattice constants, there is formed a precise thin layer laminated body of one atomic layer thickness at regular intervals. Here, two kinds of thin films A and B consisting of a combination of a semiconductor, metal or insulator having a different coefficient of X-ray absorption but substantially equal lattice constant, are formed into a laminate body on a substrate. If X-rays are then exposed in parallel to the interface of the laminated layer of this thin film, since the thin film A and the thin film B are different in coefficient of X-ray absorption, a parallel streak-like X-ray exposed pattern of about 3 Å thickness (one atomic layer) is formed on a resist This is due to the difference of X-ray absorption amount.

GaP and AlP can be used as compound semiconductors. Were case of a GaP has a large coefficient of X-ray absorption and AlP has a small coefficient of X-ray absorption, so that when X-rays are exposed to such an alternate laminated body, a line pattern of ultrafine intervals of about one atomic layer (about 3 Å) is formed on a resist which receives the transmitted X-ray light.

A laminated layer body of metal (compound) and insulator (compound) can be formed using the crystal growth method even though they are not semiconductors e.g. a combination of CoSi and CaF, can be made using crystal growth methods. A combination of materials having the same or approximately the same lattice constant is usable. Examples thereof are illustrated as follows:

combination of metals, $CoSi_2$ and $NiSi_2$; Pb—Sn and $CoSi_2$;

combination of metal and semiconductor, Cu and C, $CoSi_2$ and Si; $NiSi_2$ and Si;

combination of intermetallic compound and semiconductor, Pb—Sn and Si;

combination of compound semiconductor and metal, GaAs and NiAl, AlAs and NiAl combination of metal and insulator, $CoSi_2$ and $SiO_2$, $NiSi_2$ and $SiO_2$;

combination of insulator and compound semiconductor, GaAs and $CaF_2$, AlAs and $CaF_2$;

combination of insulator and semiconductor, Si and $CaF_2$.

Therefore, thin film materials are limited to combinations of compound semiconductor, intermetallic compound and insulator (compound) materials having the same lattice constant and different coefficient of X-ray absorption.

EMBODIMENT

EXAMPLE 1

An embodiment of the present invention is explained by referring to the accompanying drawings. FIG. 2(A) shows the condition of successively applying a compound semiconductor GaInAs layer 2, an InP layer 3, a GaInAs layer 4, and an InP layer 5 on an InP substrate 1 by an epitaxial crystal growth method. The epitaxial crystal growth method was carried out by an organic metal vapor phase epitaxial (OMVPE) method.

FIG. 2(B) shows the condition of removing part of the GaInAs layers 2 and 4 by selectively etching with a sulfuric acid etching agent. FIG. 3 shows a comb-line X-ray exposure mask forming an unevenness 6 by ion milling the etched one in the above case. Reference numeral 7 shows an X-ray irradiation direction, and shows irradiation parallel to a cleavage plane of a thin film. In FIG. 3, when a portion H is more than 2000 Å, (for the in case of irradiating X-ray 7, a streak-like mask is formed on a resist due to the thickness of the thin film a streak-like mask can be formed and the difference of X-ray absorptivity. In this case, regardless of whether X-ray absorption factors of the thin films are different or the same.

EXAMPLE 2

A method of manufacturing an X-ray mask by an epitaxial crystal growth method according to the present invention will now be explained. First, a superlattice is manufactured by alternately depositing materials having different coefficients of X-ray absorption by metal organic chemical vapor deposition (MOCVD). The absorption coefficient of GaP is large and that of AlP is small. Hence substrate 44 has materials alternately deposited unit with a small absorption coefficient and a large, absorption coefficient. When an X-ray is incident thereon and parallel to the interface of the thin film as shown in FIG. 6, X-ray transmission waves become uneven, and the superlattice plays the role of a mask. Here, 18 is an incident X-ray, and 19 is an output X-ray.

Therefore, in order to take contrast of X-rays passed through a mask, a superlattice should be composed of a combination of materials having large differences of absorption coefficients.

Here, the equation giving an absorption co-efficient of a compound consisting of atoms A, B, C, ... is as follows.

$$s = \frac{\rho}{m_x} \times \left( \frac{m_A}{S_A} + \frac{m_B}{S_B} + \frac{m_C}{S_C} + \ldots \right) \qquad (1)$$

where, $\rho$ is the density of a semiconductor of the compound, $S_A$, $S_B$, $S_C$ ... are absorption coefficients of the respective atoms, $m_A$, $m_B$, $m_C$ ... are atomic weights of the respective atoms, and $m_s$ is the molecular weight of the compound. Table 1 shows typical absorption coefficients of compound semiconductors.

TABLE 1

| | Absorption coefficient of compound semiconductor ($\mu m^{-1}$) | | | | | |
|---|---|---|---|---|---|---|
| | semiconductor | | | | | |
| wavelength | GaAs | AlAs | InP | GaInAs | GaP | AlP |
| 0.83 nm (Al-L) | 2.85 | 1.53 | 1.27 | 2.54 | 1.6 | 0.13 |
| 1.33 nm (Cu-L) | 1.2 | 0.83 | 3.7 | 2.67 | 0.87 | 0.47 |
| 4.47 nm (C-K) | 13.7 | 10.7 | 6.5 | 10.6 | 11.9 | 8.6 |

Moreover, the materials to be combined are limited to lattice alignment, so that very disparate materials cannot be used. Within the range of Table 1, a combination of GaP and AlP has lattice alignment, for the case of Al-L line (X-ray of wavelength: 0.83 nm), if 1.57 $\mu m$ of superlattice is transmitted, and a contrast of 10 is obtained from X-ray which pass through a GaP layer and X-rays which pass through an AlP layer. Consequently, the combination of GaP and AlP is suitable as a mask.

An experiment of the present invention was conducted by setting the condition to be within a range in which the inventors can test. The material was a combination of InP/GaInAs with lattice alignment, and a superlattice was manufactured by an organic metal vapor phase growth method (OMVPE). Moreover, a Cu-L line (1.33 nm) was used as the X-ray. In this case, there is almost no difference between absorption coefficients of X-rays, that is, InP is 3.6 ($\mu m^{-1}$) and GaInAs is 2.7 ($\mu m^{-1}$). Therefore, a mask was manufactured by selectively etching GaInAs with a sulfuric etching agent.

Every three layers of InP/GaInAs superlattices of 400 nm pitch and 200 nm pitch were grown by an organic metal vapor phase crystal growth method.

The superlattice was cleaved, and its cleavage was etched with the use of a sulfuric etching agent ($H_2SO_4$:- $H_2O_2$:$H_2O$ = 1:1:10) at 0° C. for 2 minutes. Hence the GaInAs layer was only selectively etched. Its depth is 300 nm. The result was shown in FIG. 8.

(1) Explanation of X-ray exposure device

FIG. 4 is a cross-sectional view of an X-ray exposure device. Reference numeral 8 is an electron gun, 9 is a Cu target, 10 is an X-ray, 11 is a stage and 12 is a sample. The device is equipped for hitting an electron beam emitted by the electron gun 8 on the Cu target 9 and hitting the X-ray of an emitted Cu-L line (wavelength $\lambda = 1.33$ nm) on the sample 12 held in the stage 11. Reference numeral 13 is a vacuum pump.

FIG. 5(A) shows a condition of manufacturing a streak-line X-ray mask pattern on a resist material 15 consisting of PMMA (polymethyl methacrylate) by the difference of an absorption amount of X-rays with the use of an X-ray exposure mask 14 manufactured by the method of the present invention. Here, 16 shows an Si substrate.

FIG. 5(B) is an enlarged view showing an enlarged part of FIG. 5(A). In FIG. 5(B), let L be a length acting as a mask and a depth of etching be L=300 nm. The equation is then as follows.

$$L = d \cos \theta \qquad (3)$$

where, d is an optical path length of X-ray, which is d=435 nm in experiment, and $\theta$ is an angle for applying x-ray, which is $\theta = 45$. The absorption coefficient of InP be $\alpha = 3.7$ $\mu m^{-1}$ and the contrasts C=5, $$C = \exp(\alpha d) \qquad (3)$$

In the X-ray exposure device shown in FIG. 4, as an X-ray source, use is made of an X-ray having characteristics generated at the time of exciting a Cu target with electron beams. The acceleration voltage of the excited electron gun 8 was 6 kV, so as to excite only the Cu-L line ($\lambda = 1.33$ nm) in the characteristic X-ray. In this situation, about 0.1% of electron energy is converted into X-rays, and the rest becomes heat, hen the target was cooled with water to prevent heating. The Cu-L ray is long in wavelength and weak in transmission as an X-ray, and only the X-ray cannot be taken outside through a beryllium (Be) window as a usual sealed-type tube lamp. Hence, it was put within a SUS tube lamp together with a transcription substrate 21 (FIG. 9) and the whole was pumped about $2 \times 10^{-6}$ Torr by means of the vacuum pump 13 and then used.

Figure 9:
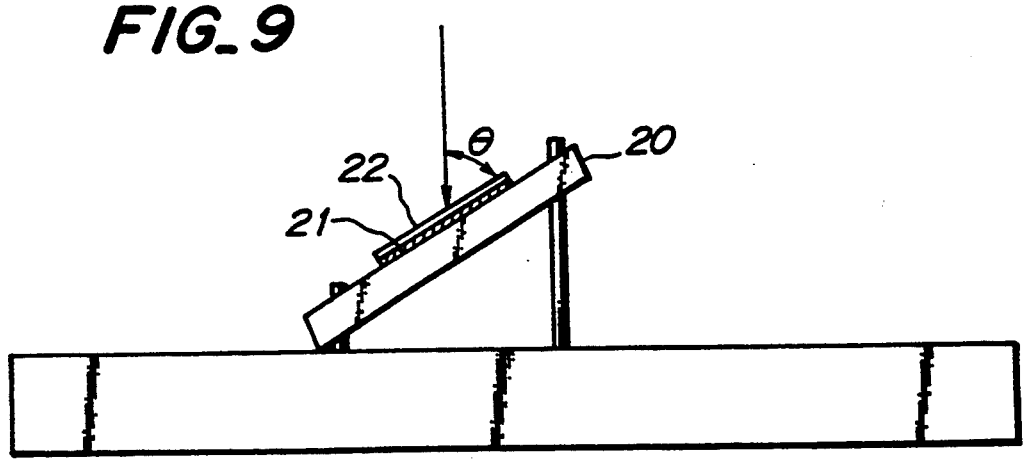
FIG. 9 is an outline of a flange of a device for manufacturing an X-ray exposure mask according to the present invention.

The present invention involves improvements to two points of a stage 11 and an extension tube. First, newly manufactured stage 11 can freely change angles with respect to a flange, so as to apply X-rays to the transcription substrate 21 at a free angle. An outline of the flange is shown in FIG. 9.

As to the extension tube, the distance from the Copper (Cu) target to the transcription substrate was 9.0 cm, which was made 39 cm by inserting a tube of 30 cm. When the initial intensity is $I_0$, intensity I of the X-rays in this case can be determined as follows.

$$I = \frac{9^3}{39^2} \times I_0 \simeq \frac{1}{20} \times I_0$$

Therefore, it becomes possible to carry out exposure with 20 times higher precision than before.

Moreover, let the distance from the X-ray source to the mask be L, and a gap between the mask and the substrate be s. In general, this produces a penumbra blur $\delta$ as shown in FIG. 10. Here, $\delta$ is expressed as following.

$$\delta = s d / L \qquad (4)$$

Therefore, the distance of L can be obtained by inserting the extension tube, and the penumbra blur δ can be controlled.

(2) X-ray exposure process (1) Resist application

A 1 cm square Si substrate is cut out, organically washed in the order of methyl-trichlene-trichlene-methyl and thereafter pure water is substituted therefor. PMMA (polymethyl methacrylate) (1:1) is applied to the substrate (first stage: 1 second 1000 rpm, second stage: 60 seconds 7000 rpm). Yielding a PMMA (polymethyl methacrylate) thickness of 1800 Å on the Si substrate. Thereafter, prebake is carried out at 170° C. for 1 hour.

(2) Exposure

A mask 27 and a transcription substrate 21 are pressed on a stage 28 as shown in FIG. 11A. Moreover, the stage 28 is inclined to 45° for suitably adjusting a distance for passing X-ray through the mask 27. Exposure time is 3 minutes and 30 seconds.

(3) Development

Figure 12:
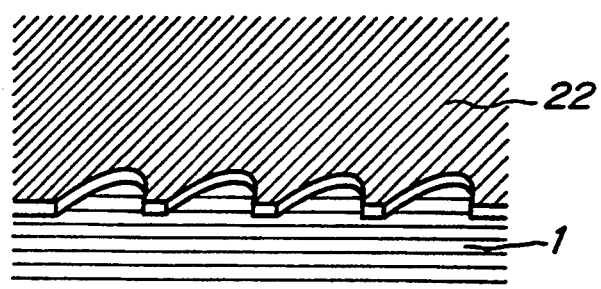
FIG. 12 is an enlarged cross section showing the transcribing condition to a resist (PMMA) on a substrate with the use of an X-ray exposure mask according to the present invention.

The exposed transcription substrate 21 is developed with 100% MIBK (methyl isobutyl ketone) for 20 minutes, and rinsed with IPA (isopropyl alcohol) for 30 seconds. As a result, it was confirmed that a pattern of the mask 27 was transcribed to a resist. This is shown in FIG. 12. In FIG. 12, the mask was broken and the pattern of 400 nm pitch was not transcribed, but 200 nm pitch is only observed.

(4) Calculation of contrast

The maximum distance d for transmitting X-rays through an InP layer of the mask portion is determined by an etching depth L and an inclined angle $\theta$ as shown in FIG. 5(B).

$$d = \frac{L}{\cos\theta} \quad (5)$$

In the present experiment, L=200 nm, $\theta=\pi/4$ and d≃424 nm.

Moreover, the contrast C between a vacuum and an absorption coefficient $\alpha$ when transmitting by a distance x is expressed as follows.

$$C = EXP(\alpha x) \quad (6)$$

The X-ray absorption coefficient of InP is 3.7 $\mu m^{-1}$, and the contrast when transmitting 424 nm is about 4.8.

(5) Allowable range of angular deviation

Figure 13:
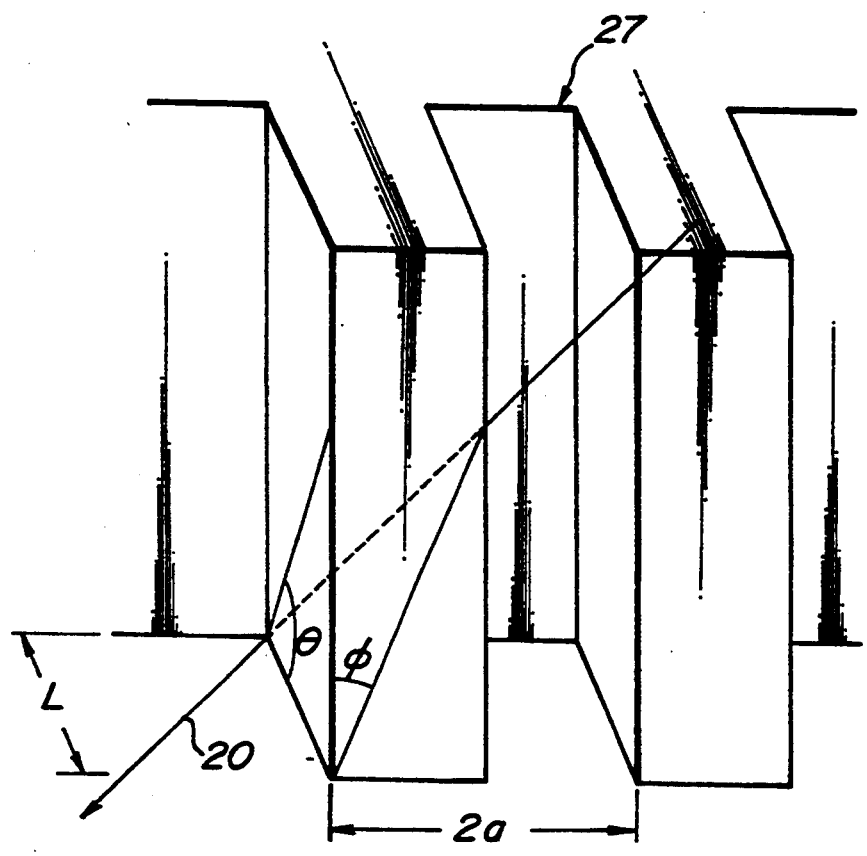
FIG. 13 is an explanatory view showing an allowable range of angular deviation for the case of X-ray exposure with the use of an X-ray exposure mask according to the present invention.

Let a mask pitch be 2a and an etching depth be L, a deviation limiting angle $\phi$ of an X-ray incident angle in case of exposure with an angle $\theta$ is in the following relation as understood from FIG. 13.

$$\frac{a}{\tan\phi} = L\tan\theta \quad (7)$$

In the one example, 2a=200 nm, L=300 nm and $\theta=\pi/4$, so that $$\phi = \tan^{-1}\left(\frac{a}{L\tan\theta}\right) = 0.32[rad] = 18°$$

This is a sufficiently amendable range. However, if a pitch is made small, the etching depth is limited from intensity of InP so that in order to make contrast about from the equations (3) and (4), said angle $\theta$ should be made small. Therefore, the allowable limiting angle $\theta$ becomes small. For example, when the pitch is 50 nm, $\phi=3.4°$, which makes angle alignment very difficult. Moreover, at 30 nm pitch as a target of the present experiment, $\phi=2.0°$. The matter of this angle alignment determines the limit of the present pitch.

Reaction of PMMA

A positive type resist PMMA (polymethyl methacrylate) used in the present invention is solved into a developer because a high molecular chain of resist is cut, and the resist changes to a low molecular weight by inelastic scattering and multi-stage reaction when X-rays, electron beam and the like are incident as shown in the following formula. This resist has a low sensitivity and is low in plasma resistance, but yields the highest resolution at present.

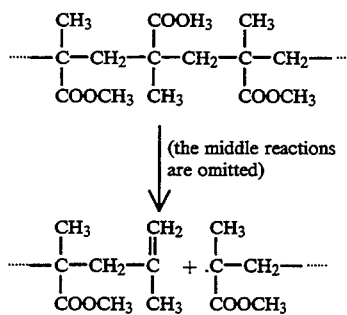

Limit of X-ray exposure

Due to its short wavelengths, X-rays should be used as a beam for exposing a very fine pitch. However, its energy is high, and consequently its absorption coefficient is small. Therefore, a mask used for X-ray exposure must be thick, and the X-ray must pass through a narrow and long waveguide. In this case, the X-ray has an expanse, which can be calculated.

Here, the X-ray is a Cu-L ray (1.33 nm), the core is a vacuum, and the clad is InP. First, the refractive index n of InP is calculated by the following equation.

$$n = 1 - 2.7 \times 10^8 \lambda^2 Z\rho/A \quad (8)$$

where, Z is the atomic number, $\rho$ is density, A is atomic number, and $\lambda$ is the X-ray wavelength in MKS unit. In calculation, the difference $\Delta$ between the index of refraction of the Cu-L ray in InP and in vacuum is $\Delta = 1 - n = 0.001$.

Here, when the clad width is made 2b, the y axis is taken as shown in FIG. 14, and the standardized waveguide width T can be determined, energy distribution is determined. However, T is as follows.

$$T = \frac{\pi 2b \sqrt{(2\Delta)}}{2} \quad (9)$$

In FIG. 15 shows the, energy distribution of each value of T. versus the ratio of y to b (Energy E standardizes the maximum value of 1.)

In FIG. 15, if a contrast is considered to be sufficient energy is 1/10, the minimum pitch of each value of T can be determined, and if the minimum pitch is made 2h, the value of b is obtained from T, so that a graph of y versus b be can be drawn. It is shown in FIG. 16.

When the core width is about 10 nm, it is understood that about 20 nm of the minimum pitch can be obtained.

This is the pitch limit formed by X-ray exposure when InP is used as the clad.

The present invention can manufacture an X-ray exposure mask by alternately laminating two kinds of compound semiconductors with an epitaxial crystal growth on layer substrate of a crystal body by controlling a thickness to about 1 atomic layer with a periodic structure of a thin film, and selecting two kinds of materials forming this periodic structure to provide a sufficient difference of X-ray absorption coefficients, taking a difference of sufficient X-ray absorption amounts in mutual thin films, projecting X-rays on a desired resist through the mask, and exposing to streak-like exposure light with certain intervals. According to the method of the present invention, it is easy to make a thickness of the film of the compound semiconductor applied to the substrate about 10 nm, and if X-ray are projected to the direction of a laminated layer interface or cleavage of the thin film, it is easy to take the length of the optical path to more than 2000 Å. Therefore, there is such a great industrial effect that an X-ray mask pattern can be precisely manufactured with intervals of less than 10 nm by a difference of X-ray absorption amount.

What is claimed is:

1. A method of manufacturing an X-ray exposure mask comprising the steps of:
   alternately laminating two kinds of material selected from the group consisting of a semiconductor, a metal and an insulator, said two kinds of material having substantially equal lattice constants and largely different coefficients of X-ray absorption on a substrate of a crystal body to a precision of less than 10 Å by an epitaxial crystal growing method; and
   cutting a mask which, when exposed to X-rays, produces streak-like X-rays on a resist as a result of the largely different coefficients of X-ray absorption between each layer.

2. A method of manufacturing an X-ray exposure mask as claimed in claim 1, wherein said step of alternately laminating comprises epitaxially growing two kinds of material selected from the group consisting of a semiconductor, a metal and an insulator having substantially equal lattice constants and largely different coefficients of X-ray absorption, on an uneven surface of a crystalline substrate having grooves with side surfaces; and
   diffusing a thin film on said surface and said side surfaces, wherein said grooves have very narrow spaces therebetween.

3. A method of manufacturing an X-ray exposure mask as claimed in claim 1, wherein said alternately laminating step comprises alternately laminating compound semiconductors having substantially equal lattice constants, selected from a group consisting of each pair of InP and GaInAs, GaP and AlP, and GaAs and AlAs.

4. A method of manufacturing an X-ray exposure mask as claimed in claim 1, wherein said alternately laminating step comprises alternately laminating a metal and an insulator having lattice constants which are substantially equal to the lattice constants of CoSi and CaF, respectively.

5. A method of manufacturing an X-ray exposure mask comprising the steps of:
   alternately laminating two kinds of material selected from the group consisting of a semiconductor, a metal and an insulator, said two kinds of material having substantially equal lattice constants and largely different coefficients of X-ray absorption on a substrate by epitaxially growing the layers to a precision of less than one atomic layer; and
   cutting a mask which, when exposed to X-rays, produces streak-like X-rays on a resist to a precision of less than 10 Å as a result of the largely different coefficients of X-ray absorption between each layer.

6. A method of manufacturing an X-ray exposure mask comprising the steps of:
   alternately laminating two kinds of material selected from the group consisting of a semi-conductor, a metal and an insulator, said two kinds of material having substantially equal lattice constants and largely different coefficients of X-ray absorption on a crystalline substrate to a precision of less than 10 Å by an epitaxial crystal growth method, thereby yielding a periodic structure;
   selectively etching either one of said two kinds of material;
   forming a groove having a depth of at least 2000 Å between adjacent layers of said periodic structure; and
   manufacturing a mask for exposing streak-like X-rays on a desired resist as a result of the largely different coefficients of X-ray absorption between each adjacent layer.

7. A method of manufacturing an X-ray exposure mask comprising the steps of:
   alternately laminating two kinds of material selected from a group consisting of a semiconductor, a metal and an insulator having substantially equal lattice constants and roughly equal coefficients of X-ray absorption in thin layers by an epitaxial crystal growth method, thereby yielding a thin film laminated body;
   removing a part of one of the thin film layers of said thin film laminated body by selective etching;
   forming an optical path difference of at least 2000 Å between adjacent layers of said laminated body; and
   cutting a mask for irradiating streak-like X-rays on a desired resist.

8. A method manufacturing an X-ray exposure mask, comprising the steps of:
   searching a crystalline substrate having a substrate lattice constant and a surface; and
   alternating epitaxially growing a first and a second material onto the surface of the crystalline substrate in layers having a thicknesses less than about 10 nanometers to a precision of less than 10 Angstroms and having lattice constants approximately equal to said substrate lattice constant, said layers providing an X-ray path length, wherein the first material has a first coefficient of absorption of X-rays and the second material has a second coefficient of absorption of X-rays and the first and second coefficients of absorption are sufficiently different from each other and the X-ray path length is greater than 2000 Angstroms, such that X-ray streaks narrower than about 10 nanometers are produced.

* * * * *